United States Patent [19]
Cox et al.

[11] Patent Number: 5,440,101
[45] Date of Patent: Aug. 8, 1995

[54] CONTINUOUS OVEN WITH A PLURALITY OF HEATING ZONES

[75] Inventors: Norman R. Cox, Eden Prairie; Jean P. Menard, Hastings; Wayne W. Baer, Minnetonka; Bradley C. Anderson, Shakopee, all of Minn.

[73] Assignee: Research, Incorporated, Eden Prairie, Minn.

[21] Appl. No.: 49,123

[22] Filed: Apr. 19, 1993

[51] Int. Cl.⁶ .................................................. F27B 9/06
[52] U.S. Cl. ........................................ 219/388; 34/212
[58] Field of Search .................. 219/388; 34/155, 216, 34/41, 267, 514, 636, 654, 212; 432/152; 228/219

[56] References Cited

U.S. PATENT DOCUMENTS

| | | | |
|---|---|---|---|
| 3,882,612 | 5/1975 | Try et al. | 34/216 |
| 3,923,449 | 12/1975 | Brock | 34/155 |
| 4,395,233 | 7/1983 | Smith et al. | 432/176 |
| 4,479,776 | 10/1984 | Smith | 432/144 |
| 4,492,041 | 1/1985 | Mansour . | |
| 4,574,182 | 4/1986 | Pescatore et al. | 219/388 |
| 4,756,091 | 7/1988 | Van Denend | 219/388 |
| 4,789,333 | 12/1988 | Hemsath | 432/176 |
| 4,854,863 | 8/1989 | Hemsath | 432/176 |
| 4,876,437 | 10/1989 | Kondo | 219/388 |
| 4,909,430 | 3/1990 | Yokota | 219/388 |
| 4,938,410 | 7/1990 | Kondo | 219/388 |
| 5,066,850 | 11/1991 | Kondo | 219/388 |
| 5,069,380 | 12/1991 | Deambrosio | 219/388 |
| 5,137,586 | 8/1992 | Klink | 148/529 |
| 5,141,147 | 8/1992 | Yokota | 228/219 |
| 5,154,338 | 10/1992 | Okuno et al. | 219/388 |
| 5,261,166 | 11/1993 | Seeley et al. | 34/41 |
| 5,263,265 | 11/1993 | Melgaard | 34/41 |

FOREIGN PATENT DOCUMENTS

| | | | |
|---|---|---|---|
| 56-74367 | 6/1981 | Japan | 219/388 |
| 3-216273 | 9/1991 | Japan | 228/51 |

OTHER PUBLICATIONS

"Heat and Mass Transfer Between Impinging Gas Jets and Solid Surfaces",: H. Martin, Institut fur Thermische Verfahrenstechnik der Universitat Karlsruh, Karlsruhe, Germany, pp. 1–60.

*Primary Examiner*—John A. Jeffery
*Attorney, Agent, or Firm*—Kinney & Lange

[57] ABSTRACT

A pass-through convection oven having a series of gas jet distributors and an exhaust system adjacent later distributors in the series to gather gas for the initial distributors in the series. A distributor in the series is formed of a pair of plenums in series in the gas flow path with a cumulative area of the passageway between them exceeding the cumulative area of the orifice from which the gas jets are formed in that distributor.

20 Claims, 5 Drawing Sheets

CONTINUOUS OVEN WITH A PLURALITY OF HEATING ZONES

BACKGROUND OF THE INVENTION

The present invention relates to industrial process ovens and, more particularly, to industrial process ovens in which items to be heated are carried on a conveyor therethrough.

The mounting of electronic circuit components on "circuit boards," which provide both positional support for such components and the electrical interconnections therebetween as well as to other portions of the system, is a long established production assembly practice in the providing of electronic circuit products. Over the times such practices have been established, the density of such electronic components has greatly increased on such boards and the circuit interconnections have correspondingly been routed closer to one another as have the leads extending from the various circuit components.

Recently, electronic circuit components, and other circuit components, have come to be mounted on such circuit boards using what is referred to as "surface mount technology." This technology has again resulted in a considerable narrowing of the spacing between leads extending from electronic circuit components intended for such surface mounting, and of the spacing between the circuit interconnections in the circuit boards used therewith. In mounting such surface mount components to metal pads on the circuit boards, solder pastes are placed at the pad locations on which the surface mount circuit component leads are to be soldered in a process something like stenciling. To do so successfully, particle sizes of the tin and lead particles in the solder paste must be made smaller as the spacing between such mounting pads decreases if the paste at each pad is to be suitably confined to the location at which it is intended to be provided.

However, as these particles become smaller, the cumulative surface area of those particles in the paste increases. Heating solder in the presence of oxygen creates oxides on such surfaces of the particles, a result which can hinder soldering because either poor reliability solder joints, or "bridging" between solder joints, will result in the presence of sufficient surface oxidation. Such oxidation depends on the kinds of metals involved, the temperatures reached by those metals during the soldering process, the surface area of the metals that is exposed, and the amount of oxygen present. Because of various requirements for successful soldering, often the only variable that can be controlled is the amount of oxygen present.

In earlier circuit component soldering processes, the amount of oxygen present was not such a significant factor as the greater extent of oxidation occurring in those process was relatively less important. That is because the solder pastes used earlier in those processes contained aggressive fluxes capable of removing such oxides during the soldering process, but such fluxes and other residues had to be cleaned from the resulting soldered circuit boards through the use of solvents. However, currently, there is a strong trend away from such solvent cleaning because of problems presented by such residues and solvents such as unwanted pollution.

In present circumstances, therefore, performing surface mount soldering processes in an inert atmosphere has been found necessary. In an inert atmosphere, such as pure enough nitrogen, oxygen is sufficiently excluded so as to permit a satisfactory soldering outcome. Typically, the inert atmosphere must exhibit a purity such that its oxygen content is less than 50 parts per million, at least during the solder reflow part of the soldering process where temperatures typically come to exceed 150° C.

Such a soldering process has been found convenient to be carried out in an oven formed in conjunction with some kind of a conveying means to provide to the oven the items intended for soldering, and to thereafter remove them from the oven. The use of an oven relatively closed to the outside permits a significant degree of control of the atmosphere therein, as is necessary if a reasonably inert atmosphere is to be provided in the vicinity of the soldering process.

An oven type commonly used for this purpose is an infrared radiation oven. Here, the dominant heating source is an emitter of infrared radiation which is absorbed by an object to be heated as a heat flux, Q, having a value of $VE_sA_{hi}K(T_s^4-T_{hi}^4)$. Here, V is the factor representing the geometric exposure to the source of the items to be heated, $E_s$ is the emissivity of the source, $A_{hi}$ is the absorptivity of the items to be heated, K is the well-known Stefan-Boltzmann constant, $T_s$ is the source temperature and $T_{hi}$ is the heated item temperature. Such an oven gives a high heating efficiency and requires a relatively low flow of the gas used in forming the inert atmosphere, a flow just sufficient to remove impurities arising because of volatiles given off during heating of the heated item and the solder paste. Further, the source temperature is easily controlled to give good control over the rate of rise of temperature of the heated item.

On the other hand, where heated items are densely populated circuit boards, some components often will partially "shade" other components with respect to the source thereby reducing the exposure factor for those components. Such shading leads to differential heating among the components, and even between different parts of the same component. Further, if there are substantial mass differences between the components, as there often are in densely populated circuit boards, the components on the board will not heat uniformly requiring the heated item to be exposed for a substantial time to the infrared radiation source if adequate temperature rise is to be assured for the leads of all components. As a result, the rate at which heated items can be conveyed through an infrared radiation dominant oven is relatively slow, a decided disadvantage in a production situation.

Alternatively, a convection heating dominant oven could be used to transfer heat to the items to be heated with a flux of $H\Delta T$ where H is the convective film coefficient and $\Delta T$ is the temperature difference between the fluid used to transfer heat in the convection heating process and the heated item. The convective film coefficient depends on several variables including velocity of the convective medium flow and the angular direction of that flow with respect to the heated item.

Since the temperature of the convective medium will usually be close to the desired temperature of the heated item, the temperature of the circuit components on the circuit board will not exceed the medium temperature. As a result, larger components can continue to absorb heat while smaller components will not overheat to thereby assure more uniform heating despite substantial mass differences in the components being heated, even in the presence of some components shading others. On the other hand, nitrogen, as the gas of the inert atmosphere, has a low heat capacity which means that high volumes of flow can be required to transfer sufficient heat to the heated items thus risking the possible moving of the electronic circuit components on boards before they adhere thereto, and certainly requiring a large amount of inert medium which can be expensive. Thus, there is desired an oven into which items to be heated can be conveyed and removed, and which will provide relatively uniform heating thereof without encountering prohibitive costs.

SUMMARY OF THE INVENTION

The present invention provides a pass-through convection oven having an initial gas jet distributor for providing gas jets directed toward and positioned about a conveyor. A subsequent gas jet distributor is to provide gas jets about and directly toward a subsequent portion of the conveyor to keep that region at a substantially higher range of temperature values than the region under the jets of the initial gas jet distributor. An exhaust means gathers gas in the latter region of the conveyor to be provided to the initial gas jet distributor. A gas jet distributor can be formed of an output gas jet plenum formed of a shell which has orifices to direct gas to the region of interest about the conveyor. An input plenum is connected across an opening of the output plenum and has passageways to permit gas to be transferred into the output plenum. The cumulative area of the passageways exceeds the cumulative area of the orifices. A heater transfers heat to gas to be provided through the orifices.

DETAILED DESCRIPTION OF THE PREFERRED EMBODIMENTS

Figure 1:
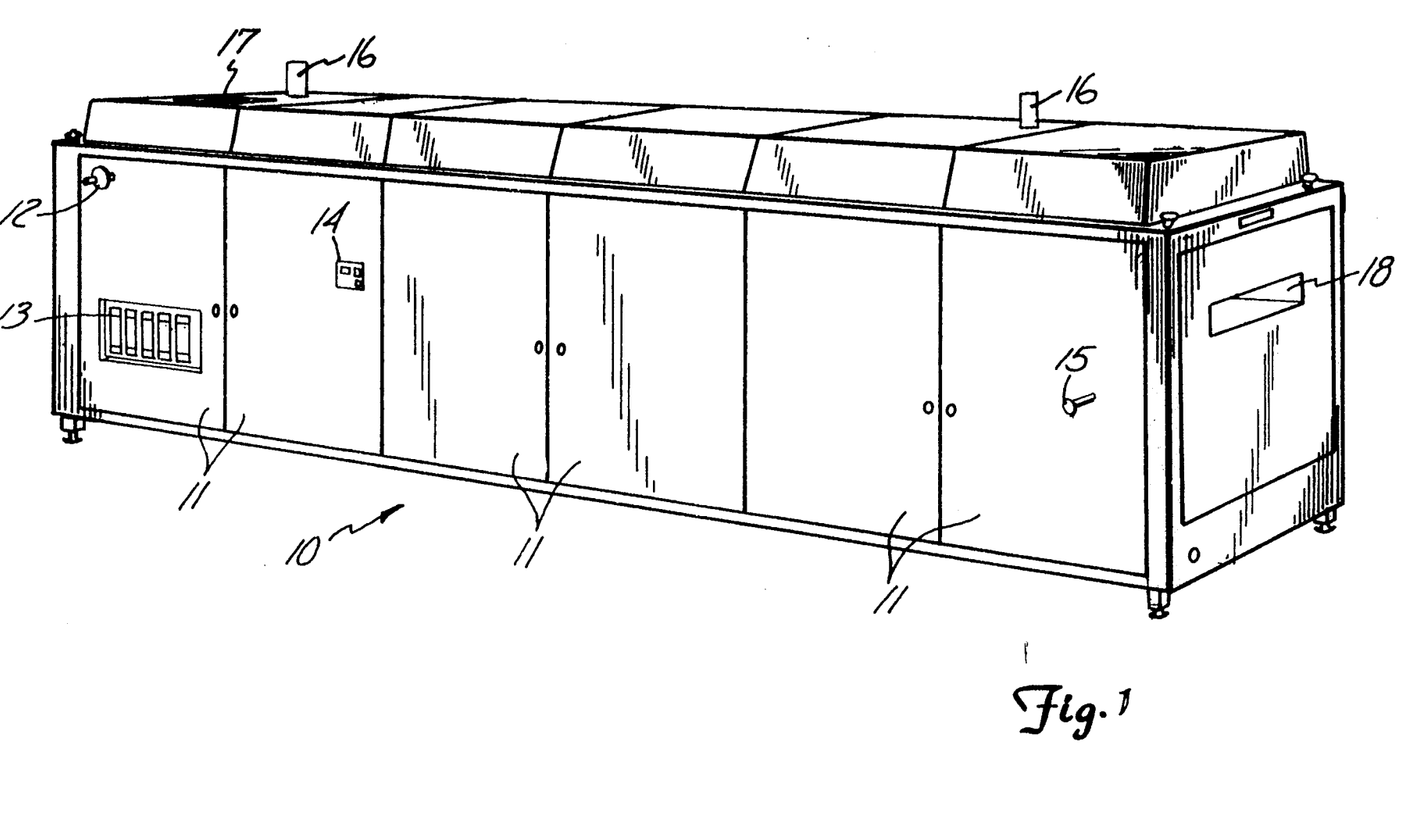
FIG. 1 shows a pictorial view of the apparatus containing the present invention.

FIG. 1 shows a pictorial view of the outside of a convection oven, 10, embodying the present invention. Three pairs of panel doors, 11, are mounted on the front side of oven 10 to provide access to the interior thereof. The door to the farthest left in FIG. 1 has a manual adjustment wheel, 12, for adjusting the separation of the sides of an edge conveyor inside oven 10, i.e. the width between the rail and chain on the left and the rail and chain on the right used to form part of the structure of that edge conveyor. A window in this same far left door, 13, provides a view of gas flow gauges contained within oven 10.

The next door further to the right shows a control panel, 14, providing various controls for operating oven 10. The door to the farthest right shows a handle, 15, on the outside for controlling the main circuit breaker inside oven 10.

A pair of process gas exhaust conduits, 16, extend above the upper surface of oven 10. Process gas exhausted from these conduits typically passes into a hood connected to the exhaust system of the facility housing the oven. A further vent, 17, exhausts cooling air forced to flow about the outside of the various heating chambers and the like contained in oven 10. Connections to a source of dry air, to a source of pure, dry nitrogen, and to a source of electrical power are provided behind the door to the far right in oven 10.

Items to be heated in oven 10 are often circuit boards having electronic and electrical circuit positioned components thereon for soldering, and, as indicated above, soldering paste portions are typically provided between interconnection points on the boards and interconnection leads on such surface mount technology electrical and electronic components. These paste portions initially hold the components positioned thereon in the positions desired therefor preceding the soldering process, as well as providing sources of solder and flux.

Such boards as items to be heated for soldering are entered into oven 10 through an input port on the left side of oven 10 in FIG. 1 which is unseen in the view presented in that figure. After the soldering process is completed, these items exit an item output port, 18, of oven 10 seen on the right end thereof in FIG. 1. The items entered in the oven input port are transported through oven 10 to output port 18 on the edge conveyor mentioned above enroute on which they are heated, soldered and cooled. Alternatively, a mesh conveyor could be used instead of an edge conveyor.

Figure 2:
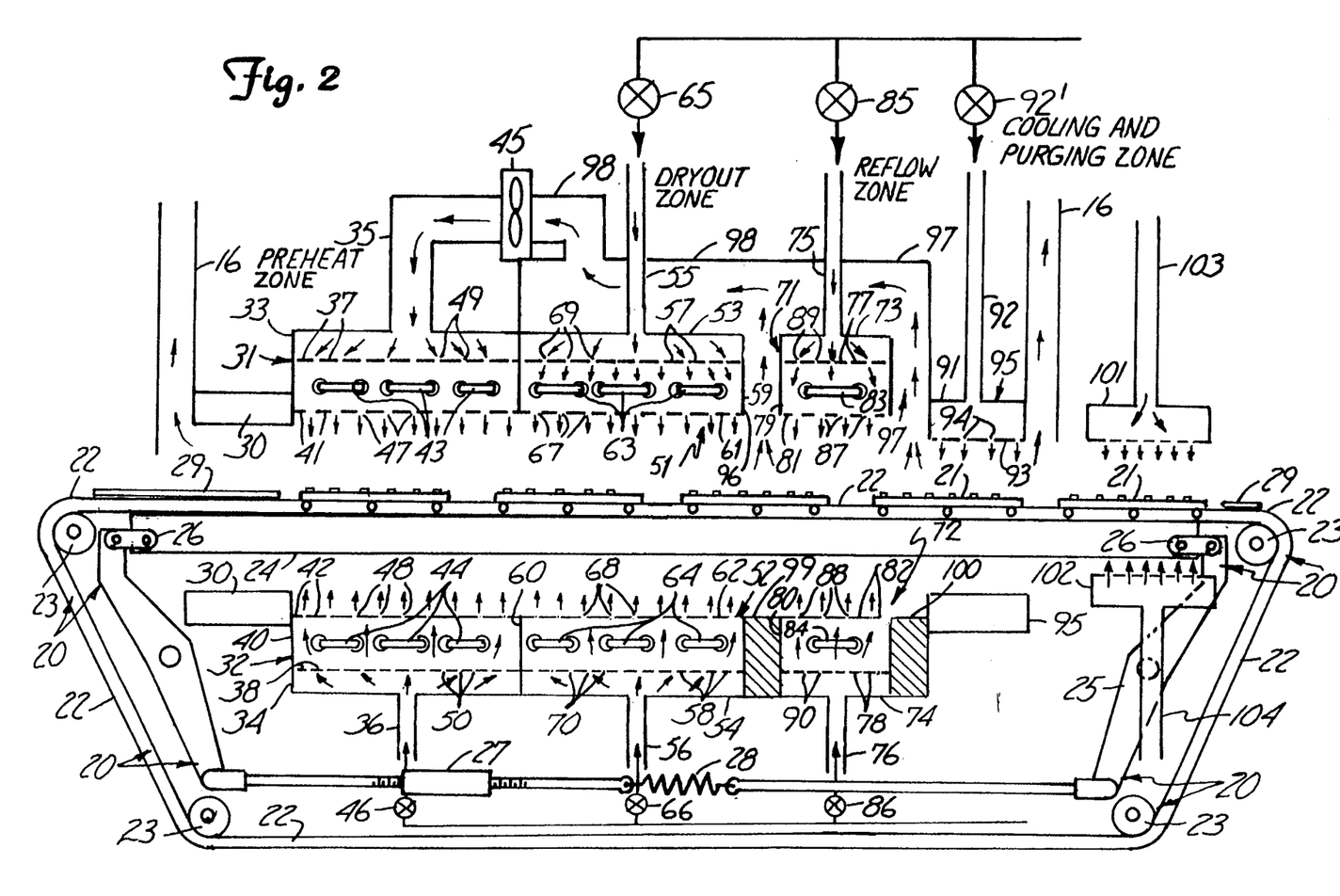
FIG. 2 shows a schematic diagram cross section of a simplified representation of the interior of the apparatus of FIG. 1 including a representation of the present invention.

FIG. 2 shows a schematicized cross section diagram of a simplified representation of the heating chambers and other apparatus internal to oven 10 of FIG. 1, the simplification and diagrammatic schematization being provided for purposes of clarity. Chamber exhaust ports are designated 16 in FIG. 2 just as they were in FIG. 1. Other equipment which may be expected to be found internal to oven 10 from the description of FIG. 1 has, in many instances, been omitted in FIG. 2 to reduce complications in the drawing and to make clear the major activities occurring in oven 10 during operation. Further, symbolic representations and exaggerated dimension representations are also used for purposes of clarity. Structural aspects appearing in a figure with numerical designations use the same designations where repeated in subsequent figures.

As previously mentioned, an edge conveyor, 20, is used to move items, 21, to be heated sufficiently for soldering purposes (although heating for other reasons is alternatively possible) through the various heating and cooling chambers to be described that are present in oven 10. Items 21, assumed here to be heated for soldering purposes, are conveyed on inwardly extending tabs mounted on two more or less parallel, spaced apart roller chains, 22, these roller chains each forming a closed loop so that when driven appear as endless chains. Chains 22 follow parallel paths, each traveling over corresponding sprockets, 23, and each being supported on a corresponding rail, 24.

Rails 24 are maintained under tensile force by corresponding pairs of pivot mounted levers, 25, each pair being linked to a corresponding rail 24 at an end of each pair member by a corresponding pair of links, 26. Lever pairs 25 place the rail links 24 under tension because of the use of a corresponding spring, 28, connected between the ends thereof opposite those connected by links 26 to its rail 24, and a corresponding turnbuckle, 27, connected to spring 28 between these same lever ends for tension adjustment. Such tensions in rails 24 stiffens them against unwanted displacements as set out in U.S. Pat. No. 4,780,040 which is hereby incorporated herein by reference and which is assigned to the same assignee as is the present application.

The pair of roller chains 22, as each is supported by its corresponding sprockets 23 and rail 24, can have the spacing therebetween changed to accommodate different batches of items to be heated, where item widths differ from batch to batch, such as batches of circuit boards 21 having different designs from batch to batch. The maximum spacing width between roller chains 22 has been selected to be 22 inches.

Roller chains 22 and rails 24 have electrical heaters, 29, positioned thereabove to prevent them from otherwise being heatsinks that would act to cool the edges of items 21 passing between these heaters while resting on the tabs extending inward from chains 22. Heaters 29 are shown only in part in FIG. 2, with the remaining portions thereof being broken away to avoid obscuring items 21 as positioned on roller chains 22.

Items 21 enter oven 10 from the left in FIG. 2 (the input port is not shown) as positioned on the tabs of roller chains 22 to be carried thereby inwardly into oven 10. These items first pass into a baffle zone having a cross-sectional opening area perpendicular to the path followed by items 21 on chains 22 of conveyor 20 which is relatively constricted as formed by a "throat" structure, 30, formed surrounding that zone. Throat structure 30 presents a smaller cross-sectional passageway area relative to those encountered further along this path followed by conveyor chains 22 in passing into the heating chambers of oven 10.

The reduction in cross-sectional passageway area in throat structure 30 increases the velocity of gases being drawn therethrough by the left-hand exhaust 16, and thereby minimizes the amount of air moving past throat structure 30 into the heating chambers of oven 10. Exhaust 16 draws air through the input port of oven 10, but draws significantly more gas (typically nitrogen) from the interior of oven 10 as supplied by the gas flow established in the heating chambers of that oven, as will be described below. Thus, there is a much greater gas flow component directed outwardly through throat structure 30 as compared to any inwardly directed flow therethrough coming through the oven entrance port.

Although the relative spacing between the two portions of throat structure 30 as shown in the diagrammatic view of FIG. 2 is greatly exaggerated for clarity, structure 30 has the overhead portion thereof spaced approximately 1.25 inches above the path portion followed by a circuit board of an item 21 moving on chains 22 of conveyor 20 through that structure. The underside part of structure 30 shown in FIG. 2 is spaced approximately the same distance below the path followed by the circuit board of such an item 21 in being conveyed by conveyor 20 therethrough. Thus, the lower part of structure 30 shown in FIG. 2 would be elevated in the actual oven structure from where shown in that figure so as not to be seen at least in part because of the presence of rail 24, a view obstruction which is avoided in FIG. 2 by showing the lower portion of structure 30 below where it is in actual practice. Structure 30 is approximately 12 inches long measured in the direction of travel of items 21 on conveyor 20, and is sufficiently wide to accommodate the maximum 22 inch spacing of chains 22 as previously indicated.

Once an item 21, in being conveyed on chains 22 of conveyor 20, passes beyond "throat" structure 30 of the baffle zone, that item 21 enters a "preheat" zone in which its temperature is raised to a value desired for drying the solder paste portions therein. This preheat zone is established by a surrounding structure including a pair of plenum structures positioned opposite one another above and below the path followed by items 21 being conveyed on conveyor 20 through that zone. The plenums in this preheat zone structure are an overhead plenum, 31, and an underside plenum, 32.

Overhead plenum structure 31 has an input plenum, 33, and underside plenum structure 32 has an input plenum 34. Input plenum 33 has a gas intake, 35, and input plenum 34 has a gas intake, 36. Input plenum 33 has a shell structure extending from gas intake 35 about an interior volume with a perforated portion, 37, or a portion with passageways therethrough formed by the perforations, serving as a controlled rate gas distributor. Similarly, input plenum 34 has a shell structure extending from gas intake 36 substantially enclosing an interior volume, and which also has a perforated portion, 38, serving as a controlled rate gas distributor.

Perforated portion 37 serves as a transfer interface between input plenum 33 and an output plenum, 39, together forming overhead plenum structure 31. Perforated portion 37 is positioned over a large opening in output plenum 39 for transferring gas thereto. Similarly, perforated portion 38 serves as a transfer interface between input plenum 34 and an output plenum, 40, which together form underside plenum structure 32. Perforated portion 38 is positioned over a large opening in output plenum 40.

Output plenum 39 receives gas through the passageways of perforated portion 37, which enters a second interior volume, this transference of gas into the second interior volume in overhead plenum structure 31 occurring in output plenum 39 which is formed by a plenum shell structure extending from the large opening therein around that volume. This shell structure also has a perforated portion, 41, or a gas jet former, facing the path followed by items 21 being moved on chains 22 through the preheat zone. The perforations in portion 41 provide orifices through which gas jets are formed over selected positions in that path, these jets being directed toward and along that path to thereby impinge on the surfaces facing upward of any items 21 being conveyed past them.

In much the same manner, output plenum 40 of underside plenum structure 32 has a shell structure from the large opening therein about an interior volume into which gas is distributed through the passageways formed by the perforations in perforated portion 38. Again, there is a perforated portion, 42, of output plenum 40 as a gas jet former having orifices established by the perforations through which gas jets are directed along and about the path followed by items 21 on chains 22 of conveyor 20 in being moved through the preheat zone. Such jets impinge on the undersides of any items 21 moving past them.

Output plenum 39 of overhead plenum structure 31 has an electrical heating arrangement, 43, passing through various portions of its interior volume. In the same manner, output plenum 40 has an electrical heating arrangement, 44, dispersed in various portions of its interior volume. These electrical heaters can be disposed directly in the interior volumes of output plenums 39 and 40, or can be placed in tubes which extend through the interior volumes of these output plenums, as is shown in FIG. 2. Each of the electrical heating arrangements has nickel-chromium filament heaters therein which are insulated from outer stainless steel sheaths by magnesium oxide powder.

The temperatures provided by these heating arrangements are controlled in a feedback loop with a microprocessor serving as a controller, there being a thermocouple mounted in each of the output plenums as a temperature sensing element to provide a feedback signal to the microprocessor indicating the temperature of that plenum. The resulting partly analog-partly digital control loop provides plenum temperature control through the well-known proportional-integral-derivative control algorithm, the thermocouple signal from each output plenum being balanced against a corresponding set point command in this feedback loop.

The source of the gas provided to gas intake 35 of overhead plenum structure 31 differs from the source of gas provided to gas intake 36 of underside plenum structure 32. Gas intake 35 is connected to a blower, 45, which brings in a recirculating gas as will be described below. Gas intake 36, on the other hand, is connected through a gas valve, 46, to a source of pressurized, pure, dry nitrogen gas.

Overhead plenum structure 31 and underside plenum structure 32 are again each 22 inches wide, and one can choose to provide a gas flow block over some of this width if chains 22 and rails 24 have been moved closer together because of the items 21 being sufficiently narrow to warrant doing so. The lengths of perforated portions 41 and 42 in the output plenums of these structures along the path followed by items 21 are about 40 inches. A somewhat greater spacing is used between each of output plenum perforated portions 41 and 42 and the path along which chains 22 convey items 21 through the preheat zone than is used in the baffle zone, as indicated above. Here, the spacing is about 1.75 inches in each instance.

As stated above, perforated portions 41 and 42 effectively position a series of gas jets over the width and the length of output plenums 39 and 40, and so along the portion of the path followed by items 21 on chains 22 in passing these structures. The gas jets are established for overhead plenum structure 31 by 102 orifices, 47, in perforated portion 41 of output plenum 39 each having a diameter of 0.218 inch to give a total orifice area of 3.81 in$^2$. Perforated portion 42 establishes such jets by having therein 61 orifices, 48, arranged over the path, each of a diameter of 0.125 inch to give a total orifice area of 0.75 in$^2$.

The passageways, 49, in perforated portion 37 of input plenum 33 are 53 in number, each with a diameter of 0.218 inch to give an passageway area total of 1.98 in$^2$. Perforated portion 38 of input plenum 54 has 36 passageways, 50, each of a diameter of 0.125 inch to give a total passageway area of 0.44 in$^2$. Thus, for overhead plenum structure 31, the ratio of the area of the orifices 47 in perforated portion 41 compared to the area of the passageways 49 in perforated portion 37 is nearly 2:1, a similar ratio being true of the ratio of the area of orifices 48 in perforated portion 42 as compared to the area of the passageways 50 in perforated portion 38. A gas flow of 1500 ft$^3$/hr in overhead plenum structure 31, forced by blower 45, with the use of such a ratio will result in a static pressure exceeding 0.5 inch of water relative to the atmosphere in overhead input plenum 33. This result assures that the gas pressures at all of the passageways in the perforated portions therein are quite similar to yield similar gas flows through each. This in turn assures that there will be a fairly even distribution of gas flows in all of the jets established by the orifices of perforated portions 41 and 42. Thus, there will be fairly even heating across each item 21 as it passes through this preheat zone.

A gas flow of only 50 ft$^3$/hr is used in underside plenum structure 32 which is supplied through valve 46 from a source capable of supplying such a volume. Such a gas flow with the use of the ratio given above results in a static pressure in underside input plenum 34 that is quite small or negligible because of the low flow rate therethrough, but since this flow only heats the bottom of the circuit board in items 21 substantial temperature differences will not be too detrimental and the differences will even out with time. Further, atmospheric-based buoyant forces aiding the heated gas in the jets to flow upward toward items 21 to heat them makes unnecessary the providing of any significant pressures or gas velocities in the underside plenum structure, as is necessary for overcoming these same forces opposing the downward directed gas flow on the top of these items provided by the jets in the overhead plenum structure. In some instances, a higher gas flow rate from underside plenum structure may be desired or needed, especially if components are being mounted on the undersides of the circuit boards in items 21, and this can be provided such as by changing the setting of valve 46.

Furthermore, this arrangement results in gas jets emanating through orifices 47 and 48 of output plenums 39 and 40, respectively, with average gas velocities of about 1000 ft/min and 150 ft/min, respectively. Given the spacing set out above of about 1.75 inches between these orifices and the path of a circuit board in an item 21 moving through the zone on chains 22 of conveyor 20, the jet gas velocity from output plenum 39 has been found sufficient to break up any boundary layers of gas formed adjacent to the upper exposed surfaces of items 21 to assure good transfer of heat from the gas in the jets to such items. Greater velocities than needed for such breakups of boundary layers do not significantly increase the heating rate of items 21 subjected to such jet flows. In addition, there is a risk of blowing the electronic and electrical circuit components, held on the circuit boards only by wet paste at this point in the process, out of the desired positions therefor on the boards or off the boards entirely.

In addition, the interior volume of input plenums 33 and 34 are each only about half that of its corresponding one of output plenums 39 and 40. As a result, there will be on the average an appreciable delay between gas entering each output plenum and leaving it. The resulting delay is effectively a dwell time in the output plenums that assures the gas to pass therethrough is heated to the desired temperature before leaving that plenum. The substantial velocity of the gas in entering the output plenums through the input plenum passageways causes some turbulence in the output plenums to assure good mixing of the gases therein to give more even heating thereof.

The substantially greater gas flows through overhead plenum structure 31 as compared to the flows through underside plenum structure 32 reflect the fact that the solder paste to be dried is present only on the upper side of the circuit boards of items 21 as are the components being held thereby, and so the heating needs are much greater on that side. Further, the gas emanating from below items 21 will be aided in moving upward to items 21 by buoyant forces.

The temperature of gases exiting the preheat zone output plenums at the orifices in perforated portions 41 and 42 is typically controlled to be from 180° C. to 220° C. for the flows chosen above depending on the type of solder paste being used and the temperature profile increase desired in items 21 as they pass through the preheat zone. Solder pastes are wet and typically applied in a thickness of 3 mm to 5 mm. The intent of the preheat zone, as indicated above, is to bring the temperature of items 21 up to a sufficiently high level to accelerate drying of that paste through typically causing the items to reach a temperature of 150° C. by the time of exit from the zone. A typical temperature profile achieved in the preheat zone of oven 10 is shown in FIG. 3 over the distance of zero to 40 inches of travel therein past throat structure 30 representing the length of that zone.

Figure 4:
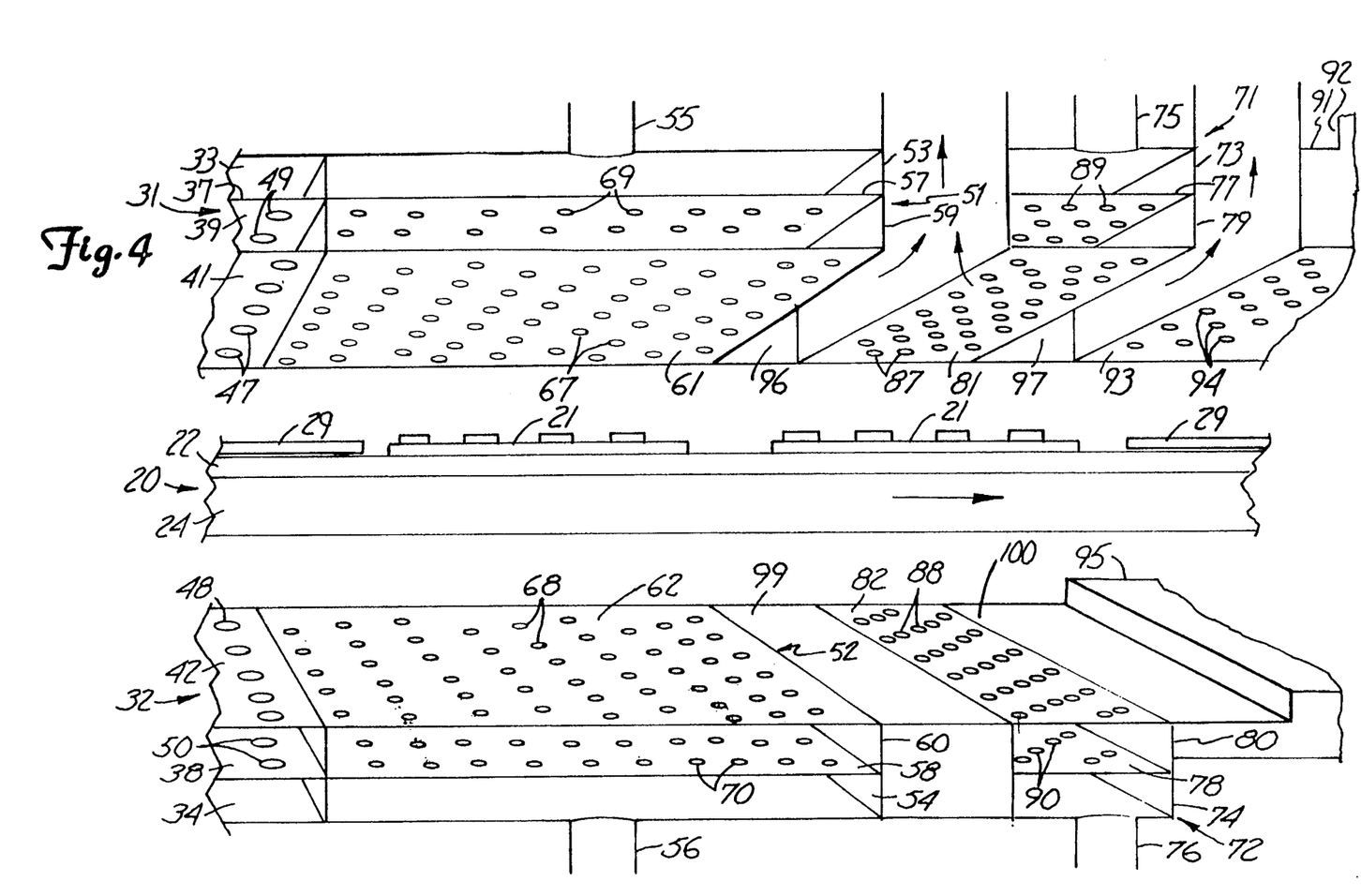
FIG. 4 shows a perspective view of a simplified representation of a portion of the interior of the apparatus of FIG. 1.

FIG. 4 shows, in a perspective view of a simplified representation of a portion of the interior of oven 10, the positioning of the orifices in a portion of perforated portions 41 and 42. In the direction followed by chains 22 in moving over rails 24 of conveyor 20, these orifices are repeated every 4.0 inches after the preceding one to give a lineal density of three per foot. At each encounter of a gas jet by an item 21 during its conveyance through the zone, the maximum heat transfer will occur between the jet and the item if the encountering surface of the item has settled to the lowest temperature that it will reach at a point just prior to the encounter. Thus, the heat energy added to that item due to encountering the preceding jet should be allowed to even out through that item before the next jet encounter, or at least the temperature gradients should be allowed to reach an appropriately small value. Hence, for a given conveyor speed, there should be sufficient spacing between orifices in the preheat zone to allow such temperature gradient reductions to occur between encounters of the items with succeeding jets to minimize gas and energy consumption in oven 10. A four inch orifice spacing in the preheat zone for a conveyor speed of 2 ft/min has been found satisfactory.

Figure 3:
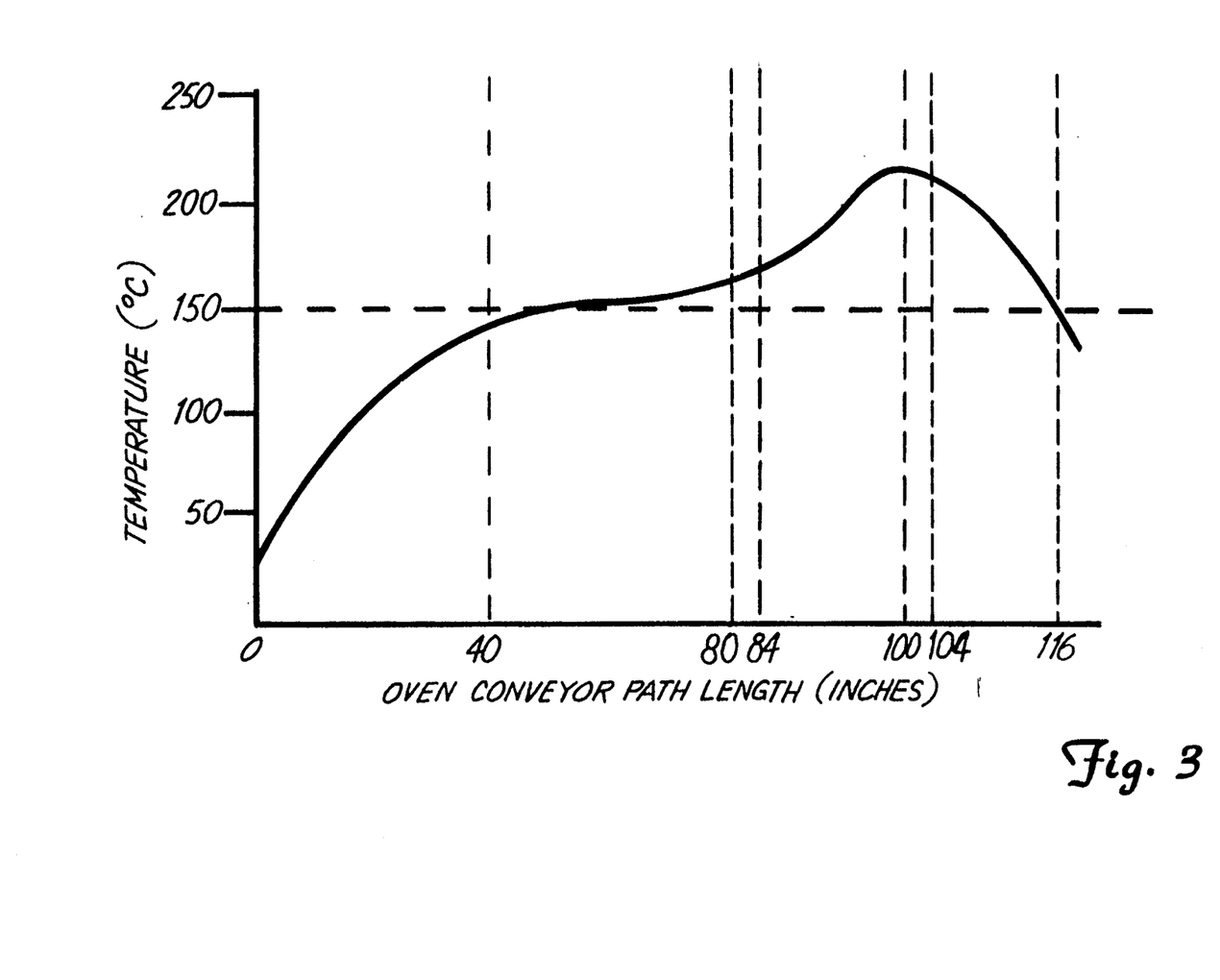
FIG. 3 shows a graph of a characteristic corresponding to the representation of FIG. 2.

After items 21 have approximately reached the dryout temperature at the end of the preheat zone indicated at the 40 inch point in FIG. 3, they are carried by chains 22 on rails 24 of conveyor 20 into the dryout zone where they are maintained at substantially that dryout temperature to complete drying the solder paste portions. Thus, there is relatively little temperature change shown in FIG. 3 between the oven path length indicia 40 and 80, the latter indicator reflecting the 40 inch length of the dryout zone.

This dryout zone is formed in much the manner of the preheat zone, there being another surrounding structure which includes another overhead plenum structure, 51, and another underside plenum structure, 52. Each of structures 51 and 52 are positioned in this zone, relative to each other and the path between them followed by items 21 in moving on chains 22, as were plenum structures 31 and 32 in the preheat zone. Overhead plenum structure 51 has an input plenum, 53, and underside plenum structure 52 has an input plenum 54. Input plenum 53 has a gas intake, 55, and input plenum 54 has a gas intake, 56. Input plenum 53 has a shell structure extending from gas intake 55 to enclose an interior volume in that shell structure which has a perforated portion, 57, through which passageways formed by the perforations permit a controlled rate distribution of gas therethrough. Similarly, input plenum 54 has a shell structure extending from gas intake 56 to enclose an interior volume, and also has a perforated portion, 58, which again permits a controlled rate gas distribution through the passageways therein formed by the perforations.

Overhead plenum structure 51 also has an output plenum, 59, having an interior volume into which gas distributed through perforated portion 57 of input plenum 53 is collected, this interior volume again being formed by a surrounding shell structure extending from an opening having perforated portion 57 positioned thereacross. Underside plenum structure 52 similarly has an output plenum, 60, having a shell structure extending from an opening about an interior volume to receive gas distributed through perforated portion 58 of input plenum 54 positioned across that opening. Output plenum 59 again has a perforated portion, 61, in its shell structure as a gas jet former, and the orifices due to the perforations in the perforated portion face conveyor 20 in being distributed along and about the path followed by items 21 in being conveyed by chains 22 through the dryout zone. In similar fashion, output plenum 60 has a perforated portion, 62, in its shell structure to provide a gas jet former, and with the orifices formed by the perforations in the perforated portion facing chains 22 and being distributed along and about the path followed by items 21 being conveyed by chains 22 through the dryout zone.

The gas reaching output plenum 59 through perforation portion 57 of input plenum 53 is again heated while in the interior volume of output plenum 59 by electric heating arrangements, 63, after being received therethrough. In a similar manner, gas in the interior volume of output plenum 60, received through perforation portion 58 from input plenum 54, is also heated with electric heating arrangements, 64. Heating arrangements 63 and 64 are constructed as were heating arrangements 43 and 44 in output plenums 39 and 40 in preheat zone plenum structures 31 and 32. The temperatures reached in output plenums 59 and 60 due to heating arrangements 63 and 64 are controlled in the manner described above for heating arrangements 43 and 44.

The source of the gas provided to gas intake 55 of overhead plenum structure 51 is here the same as the source of gas provided to gas intake 56 of underside plenum structure 52. Gas intake 55 is connected through a gas valve, 65, and gas intake 56 is connected through a gas valve, 66, to a source of pressurized, pure, dry nitrogen.

Overhead plenum structure 51 and underside plenum structure 52 are again each 22 inches wide, and one can choose to provide a gas flow block over some of this width if chains 22 and rails 24 have been moved closer together because of the items 21 being sufficiently narrow to warrant doing so. The lengths of perforated portions 61 and 62 in the output plenums of these structures along the path followed by items 21 are about 40 inches. Once again, a somewhat greater spacing is used between each of output plenum perforated portions 61 and 62 and the path along which chains 22 convey items 21 through the dryout zone than is used in the baffle zone, as indicated above. Here again, the spacing is about 1.75 inches in each instance.

As stated above, perforated portions 61 and 62 effectively position a series of gas jets over the width and the length of output plenums 59 and 60, and so along the portion of the path followed by items 21 on chains 22 in passing these structures. The gas jets are established for overhead plenum structure 51 by 61 orifices, 67, in perforated portion 61 of output plenum 59 each having a diameter of 0.125 inch to give a total orifice area of 0.75 in$^2$. Perforated portion 62 establishes such jets by having therein 61 orifices, 68, arranged over the path, each of a diameter of 0.125 inch to give a total orifice area of 0.75 in$^2$. Thus, since there is not to be a large increase in temperature forced on items 21 in the dryout zone, much less orifice area is provided in perforated portion 61 of output plenum 59 than in perforated portion 41 of output plenum 39 used in the preheat zone.

The passageways, 69, in perforated portion 57 of input plenum 53 are 36 in number, each with a diameter of 0.125 inch to give a passageway area total of 0.44 in. The smaller passageway area in perforated portion 57 is in accord with the smaller orifice area provided in perforated portion 61 of output plenum 59. Perforated portion 58 of input plenum 54 has 36 passageways, 70, each of a diameter of 0.125 inch to give a total passageway area of 0.44 in$^2$. Thus, for overhead plenum structure 51, the ratio of the area of the orifices 67 in perforated portion 61 compared to the area of the passageways 69 in perforated portion 57 is nearly 2:1, a similar ratio being true of the ratio of the area of orifices 68 in perforated portion 62 as compared to the area of the passageways 70 in perforated portion 58. Gas flows of 650 ft$^3$/hr in overhead plenum structure 51 and 50 ft$^3$/hr in underside plenum structure 52, supplied through valves 55 and 66 from a source capable of supplying such volumes, with the use of these ratios will result in a static pressure exceeding 0.5 inch of water relative to the atmosphere in overhead input plenum 53. This result again assures that the gas pressures at all of the passageways in the perforated portions therein are quite similar to yield similar gas flows through each to again assure fairly even heating across each item 21 as it passes through this dryout zone. Again, there will be a negligible static pressure in underside input plenum 54.

In this arrangement, gas jets emanate through orifices 67 and 68 of output plenums 59 and 60, respectively, with average gas velocities of about 2100 ft/min and 150 ft/min, respectively. Given the spacing set out above of about 1.75 inches between these orifices and the path of a circuit board in an item 21 moving through the zone on chains 22 of conveyor 20, the jet gas velocity from output plenum 59 has been found sufficient to break up any boundary layers of gas formed at the temperatures of this zone adjacent to the upper exposed surfaces of items 21 to assure good transfer of heat from the gas in the jets to such items. Here too, greater velocities than needed for such breakups of boundary layers, especially at the higher flow velocities provided in this zone, do not substantially increase the heating rate of items 21 subjected to such jet flows. Again, unduly large gas velocities risk blowing the electronic and electrical circuit components, held on the circuit boards only by partially dried paste at this point in the process, out of the desired positions therefor on the boards or off the boards entirely since they are spaced only 1.75 inches from the board level in items 21.

Here too, the interior volume of input plenums 53 and 54 are each only about half that of its corresponding one of output plenums 59 and 60. Thus, there is again a delay that is effectively a dwell time in the output plenums to assure that the gas to pass therethrough is heated to the desired temperature before leaving that plenum. Again, the substantial velocity of the gas in entering the output plenums through the input plenum passageways causes some turbulence in the output plenums to assure good mixing of the gases therein to give more even heating thereof. The substantially greater gas flows through overhead plenum structure 51 as compared to the flows through underside plenum structure 52 again reflects that the solder paste to be dried is present only on the upper side of the circuit boards of items 21.

Figure 5:
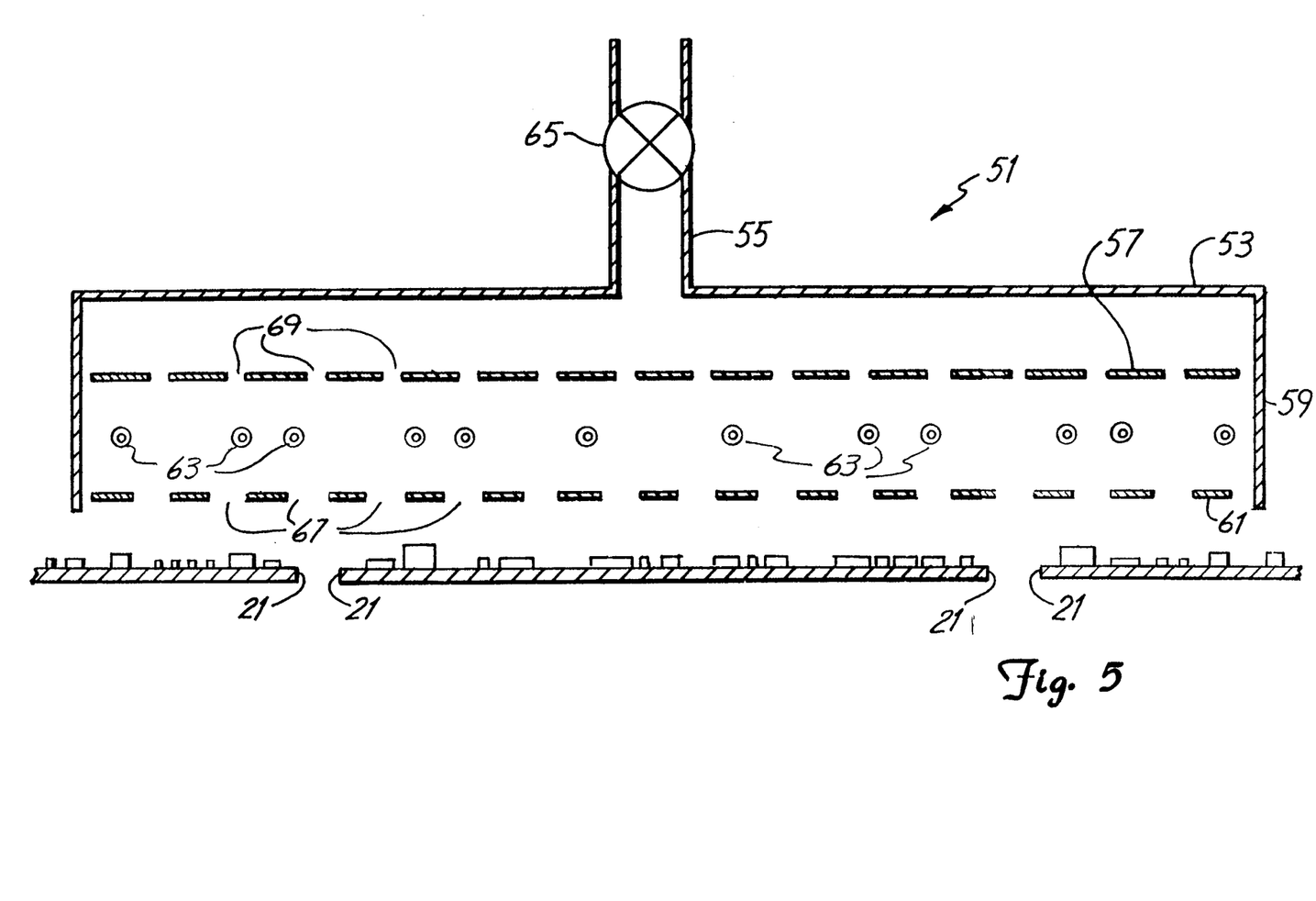
FIG. 5 shows a cross section view of a structure in FIGS. 2 and 4.

A less exaggerated depiction of some of the dimensions and spacings is provided by the cross section view of dryout zone overhead plenum structure 51 shown in FIG. 5. As can be seen, items 21 pass rather close to orifices 67. The difference in orifice and passageway areas in this structure is suggested by this depiction, as is the difference in interior volumes in input plenum 53 and output plenum 59.

The temperature of gases exiting the dryout zone output plenums at the orifices in perforated portions 61 and 62 is typically controlled to be from 170° C. to 185° C. for the flows chosen above depending on the type of solder paste being used and assuming a temperature around 150° C. is desired to be maintained in items 21 for drying them as they pass through the dryout zone. A typical temperature result achieved in the dryout zone of oven 10 is shown in FIG. 3 over the distance of 40 to 80 inches of travel therein past throat structure 30, this distance representing the length of that zone.

FIG. 4 shows, in a perspective view of a simplified representation of a portion of the interior of oven 10, the positioning of the orifices in a portion of perforated portions 61 and 62. In the direction followed by chains 22 in moving over rails 24 of conveyor 20, these orifices are again repeated every 4.0 inches after the preceding one to give a lineal density of three per foot for much the same reasons as in the preheat zone.

After items 21 have been maintained approximately at the dryout temperature to the end of the dryout zone indicated at the 80 inch point in FIG. 3, they are carried by chains 22 on rails 24 of conveyor 20 into the reflow zone where they are subjected to a relatively sharp increase in temperature to cause the solder in the dried solder paste portions to melt and flow. Hence, there is a relatively large increase in temperature shown in FIG. 3 over the relatively short distance between the oven path length indicia 84 and 100, the latter indicator reflecting the 16 inch length for the reflow zone. Note that a 4.0 inch long (22 inches wide) overhead intake duct, to be described later as part of the recirculation system for the preheat zone, is passed by items 21 before they reach the reflow zone. No similar duct is provided on the underside.

This reflow zone is formed in much the same manner as the preheat and dryout zones, there being another surrounding structure which includes another overhead plenum structure, 71, and another underside plenum structure, 72. Each of structures 71 and 72 are positioned in this zone, relative to each other and the path between them followed by items 21 in moving on chains 22, as were plenum structures 31 and 32 in the preheat zone, and as were plenum structures 51 and 52 in the dryout zone. Overhead plenum structure 71 has an input plenum, 73, and underside plenum structure 72 has an input plenum, 74. Input plenum 73 has a gas intake, 75, and input plenum 74 has a gas intake, 76. Input plenum 73 has a shell structure extending from gas intake 75 to enclose an interior volume in that shell structure which has a perforated portion, 77, through which passageways formed by the perforations permit a controlled rate distribution of gas therethrough. Similarly, input plenum 74 has a shell structure extending from gas intake 76 to enclose an interior volume, and also has a perforated portion, 78, which again permits a controlled rate gas distribution through the passageways therein formed by the perforations.

Overhead plenum structure 71 also has an output plenum, 79, having an interior volume into which gas distributed through perforated portion 77 of input plenum 73 is collected, this interior volume again being formed by a surrounding shell structure extending from an opening having perforated portion 77 positioned thereacross. Underside plenum structure 72 similarly has an output plenum, 80, having a shell structure extending from an opening about an interior volume to receive gas distributed through perforated portion 78 of input plenum 74 positioned across that opening. Output plenum 79 again has a perforated portion, 81, in its shell structure as a gas jet former, and the orifices due to the perforations in the perforated portion face conveyor 20 in being distributed along and about the path followed by items 21 in being conveyed by chains 22 through the reflow zone. In similar fashion, output plenum 80 has a perforated portion, 82, in its shell structure to provide a gas jet former, and with the orifices formed by the perforations facing chains 22 and being distributed along and about the path followed by items 21 being conveyed by chains 22 through the reflow zone.

The gas reaching output plenum 79 through perforation portion 77 of input plenum 73 is again heated while in the interior volume of output plenum 79 by electric heating arrangements, 83, after being received therethrough. In a similar manner, gas in the interior volume of output plenum 80, received through perforation portion 78 from input plenum 74, is also heated with electric heating arrangements, 84. Heating arrangements 83 and 84 are constructed as were heating arrangements 43 and 44 in output plenums 39 and 40 in preheat zone plenum structures 31 and 32, and as were heating arrangements 63 and 64 in output plenums 59 and 60 in dryout zone plenum structures 51 and 52. The temperatures reached in output plenums 79 and 80 due to heating arrangements 73 and 74 are controlled in the manner described above for heating arrangements 43, 44, 63 and 64.

The source of the gas provided to gas intake 75 of overhead plenum structure 71 is here the same as the source of gas provided to gas intake 76 of underside plenum structure 72. Gas intake 75 is connected through a gas valve, 85, and gas intake 76 is connected through a gas valve, 86, to a source of pressurized, pure, dry nitrogen.

Overhead plenum structure 71 and underside plenum structure 72 are again each 22 inches wide, and one can choose to provide a gas flow block over some of this width if chains 22 and rails 24 have been moved closer together because of the items 21 being sufficiently narrow to warrant doing so. The lengths of perforated portions 81 and 82 in the output plenums of these structures along the path followed by items 21 are about 16 inches. Once again, a somewhat greater spacing is used between each of output plenum perforated portions 81 and 82 and the path along which chains 22 convey items 21 through the reflow zone than is used in the baffle zone, as indicated above. Here once again, the spacing is about 1.75 inches in each instance.

As stated above, perforated portions 81 and 82 effectively position a series of gas jets over the width and the length of output plenums 79 and 80, and so along the portion of the path followed by items 21 on chains 22 in passing these structures. The gas jets are established for overhead plenum structure 71 by 111 orifices, 87, in perforated portion 81 of output plenum 79 each having a diameter of 0.093 inch to give a total orifice area of 0.75 in$^2$. Perforated portion 82 establishes such jets by having therein 111 orifices, 88, arranged over the path, each of a diameter of 0.093 inch to give a total orifice area of 0.75 in$^2$. Thus, since there is to be a relatively large increase in temperature forced on items 21 over a relatively short distance in the reflow zone, the same orifice area is provided in perforated portion 81 of output plenum 79 as was provided in perforated portion 61 of output plenum 59 used in the dryout zone.

The passageways, 89, in perforated portion 77 of input plenum 73 are 32 in number, each with a diameter of 0.187 inch to give a passageway area total of 0.88 in$^2$. The increased passageway area in perforated portion 77 is nearly equal to that of the orifice area provided in perforated portion 81 of output plenum 79 to provide a higher velocity, greater volume flow of gas to items 21 to boost surface temperatures up rapidly to melt the solder but without greatly increasing the interior temperatures of items 21. Perforated portion 78 of input plenum 74 has 32 passageways, 90, each of a diameter of 0.187 inch to give a total passageway area of 0.88 in$^2$. Thus, for overhead plenum structure 71, the ratio of the area of the orifices 87 in perforated portion 81 compared to the area of the passageways 89 in perforated portion 77 is about 1:1, a similar ratio being true of the ratio of the area of orifices 88 in perforated portion 82 as compared to the area of the passageways 90 in perforated portion 78 to give the desired greater velocities and flows in the reflow zone indicated above. Gas flows of 700 ft/hr in overhead plenum structure 51 and 50 ft$^3$/hr in underside plenum structure 52, supplied through valves 75 and 76 from a source capable of supplying such volumes, with the use of these ratios will result in a pressure exceeding 0.5 inch of water relative to the atmosphere in overhead input plenum 73. This result again assures that the gas pressures at all of the passageways in the perforated portions therein are quite similar to yield similar gas flows through each to again assure fairly even heating across each item 21 as it passes through this reflow zone. Underside input plenum 74 will again have a negligible static pressure.

In this arrangement, gas jets emanate through orifices 87 and 88 of output plenums 79 and 80, respectively, with average gas velocities of about 2200 ft/min and 150 ft/min, respectively. Given the spacing set out above of about 1.75 inches between these orifices and the path of a circuit board in an item 21 moving through the zone on chains 22 of conveyor 20, the jet gas velocity from output plenum 59 has been found sufficient to break up any boundary layers of gas formed at the temperatures of this zone adjacent to the upper exposed surfaces of items 21 to assure good transfer of heat from the gas in the jets to such items. Here too, greater velocities than needed for such breakups of boundary layers, especially at the higher flow velocities provided in this zone, do not substantially increase the heating rate of items 21 subjected to such jet flows, and again risk blowing the electronic and electrical circuit components, held on the circuit boards only by molten solder at this point in the process, out of the desired positions therefor on the boards or off the boards entirely.

Here again, the interior volume of input plenums 73 and 74 are each only about half that of its corresponding one of output plenums 79 and 80. Thus, there is again a delay, although shorter because of the similarity of the orifice and passageway areas in plenum structures 71 and 72, that is again effectively a dwell time in the output plenums to assure that the gas to pass therethrough is heated to the desired temperature before leaving that plenum. This shorter dwell time is compensated by increasing the temperature levels in output plenums 79 and 80. Again, the substantial velocity of the gas in entering the output plenums through the input plenum passageways causes some turbulence in the output plenums to assure good mixing of the gases therein to give more even heating thereof. The substantially greater gas flows through overhead plenum structure 71 as compared to the flows through underside plenum structure 72 again reflects that the solder paste with the solder to melt is present only on the upper side of the circuit boards of items 21.

The temperature of gases exiting the dryout zone output plenums at the orifices in perforated portions 81 and 82 is typically controlled to be from 240° C. to 300° C. for the flows chosen above depending on the type of solder paste being used and assuming a temperature around 150° C. is desired to be maintained in items 21 for drying them as they pass through the dryout zone. A typical temperature result achieved in the dryout zone of oven 10 is shown in FIG. 3 over the distance of 40 to 80 inches of travel therein past throat structure 30, this distance representing the length of that zone.

FIG. 4 shows, in a perspective view of a simplified representation of a portion of the interior of oven 10, the positioning of the orifices in a portion of perforated portions 81 and 82. In the direction followed by chains 22 in moving over rails 24 of conveyor 20, these orifices are again repeated every 2.0 inches after the preceding one to give a lineal density of six per foot to provide the sharp increase in temperature for items 21 over a short distance to raise upper surface temperatures thereof without too much of an increase in interior temperatures.

After items 21 have been brought to upper surface temperatures sufficient to melt the solder in the solder paste portions thereon by the time they reach the end of the reflow zone indicated at the 100-inch point in FIG. 3, they are carried by chains 22 on rails 24 of conveyor 20 into the following cooling and purging zone where they are subjected to a relatively sharp decrease in temperature to cause the molten solder to solidify and prevent any further temperature increases in interior portions of items 21. Hence, there is a relatively large decrease in temperature shown in FIG. 3 over the relatively short distance between the oven path length indicia 104 and 116, the latter indicator reflecting the 12-inch length for the cooling and purging zone. Note that a 4.0 inch long (22 inch wide) overhead intake duct, to be described later as part of the recirculation system for the preheat zone, is passed by items 21 before they reach the cooling and purging zone. No similar duct is provided on the underside.

This cooling and purging zone is formed in much the same manner as the baffle zone, there being another surrounding structure which here however includes an overhead plenum, 91, as shown in FIGS. 2 and 4. Plenum 91 has a shell structure extending from a gas intake, 92, to enclose an interior volume which also has a perforated portion, 93, with the orifices, 94, formed by the perforations therein to permit a controlled rate distribution of gas therethrough. Orifices 94 are distributed along and about the path followed by the circuit boards in items 21 in being moved on chains 22 over rails 24 of conveyor 20.

Gas intake 92 is suited for connection to a source of pressurized, pure, dry nitrogen through a gas valve, 92'. Nitrogen gas must be used in this first cooling stage after solder reflow since any oxygen reaching the solder while such solder is still at elevated temperatures could result in oxidation occurring leading to unsatisfactory solder joints. This source must be capable of supplying nitrogen at a rate of 200 to 300 ft$^3$/hr to provide sufficient cooling in this zone.

The cooling and purging zone has a crosssectional opening area perpendicular to the path followed by items 21 on chains 22 of conveyor 20 which is relatively constricted as formed by a "throat" structure, 95, formed surrounding that zone which includes plenum 91. Throat structure 95 presents a smaller cross-sectional passageway area relative to those encountered previously, after the baffle zone, along the path followed by conveyor chains 22 in passing into the heating chambers of oven 10.

The reduction in cross-sectional passageway area in throat structure 95 increases the velocity of gases being drawn therethrough by the right-hand exhaust 16 in FIG. 2, and thereby minimizes the amount of air moving past throat structure 95 into the heating chambers of oven 10. Exhaust 16 draws air through output port 18 of oven 10, but draws significantly more gas (typically nitrogen) from the interior of oven 10 as supplied by the gas flow established in the heating chambers of that oven, as has been described. Thus, there is a much greater gas flow component directed outwardly through throat structure 95 as compared to any inwardly directed flow therethrough coming through oven output port 18.

Although the relative spacing between the two portions of throat structure 95 as shown in the diagrammatic view of FIG. 2 is here again greatly exaggerated for clarity, structure 95 has the overhead portion thereof spaced approximately 1.25 inches above the path portion followed by a circuit board of an item 21 moving on chains 22 of conveyor 20 through that structure. The underside part of structure 95 shown in FIG. 2 is spaced approximately the same distance below the path followed by the circuit board of such an item 1 in being conveyed by conveyor 20 therethrough. Structure 95 is approximately 12 inches long measured in the direction of travel of items 21 on conveyor 20, and is sufficiently wide to accommodate the maximum 22 inch spacing of chains 22 as previously indicated.

Returning now to the two overhead intake ducts on either side of the reflow zone mentioned above, these two 4-inch long (exceeding 22 inches in width) ducts, 96 and 97, are shown provided in FIGS. 2 and 4 at locations adjacent where the greatest flows from a pressurized, pure, dry source of nitrogen are introduced into oven 10. That is, ducts 96 and 97 are positioned adjacent to the gas flows occurring through plenum structure 71 in the reflow zone supplemented by the gas flows provided through plenum structure 51 in the dryout zone and the gas introduced through plenum 91 in the cooling and purging zone. Although the gas so introduced after heating does not remain as pure in these zones as it was before such introduction, due to volatiles mixing with it as they escape from the solder paste portions in items 21 during the melting of the solder, this gas remains sufficiently pure to reuse for purposes of providing heat through the gas jets in the preheat zone by being directed through plenum structure 31 therein. The reduced purity of this gas introduced through plenum structure 31 is usually not a significant problem in the preheat zone as the temperatures of items 21 there have not reached values which might lead to reactions with the impurities in this recirculated gas forming the jets through orifices 47 of output plenum 39 in that zone. Not only is there a substantial saving in the relatively expensive nitrogen needed to operate oven 10 by this recirculation arrangement, there are also savings in the cost of heating the gas which has been previously heated to substantial temperatures in plenum structure 71 supplemented by that gas obtained, and heated in, plenum structure 51 in the dryout zone.

Intake ducts 96 and 97 merge into a single duct, 98, which is brought to the intake side of blower 45. The output side of blower 45 is connected to gas intake 35 of input plenum 33 in plenum structure 31 of the preheat zone, as previously described. As previously indicated, blower 45 must be able to draw 1500 ft³/hr through duct 98 from intake ducts 96 and 97 to sufficiently supply recirculated gas to the preheat zone through overhead plenum structure 31.

A pair of spacers, 99 and 100, are located opposite ducts 96 and 97 across the path followed by the circuit boards in items 21 in moving through the cooling and purging zone on chains 22 over rails 24 in conveyor 20. The duct and spacer encountered first by items 21 in moving through this zone, duct 96 and spacer 99, occur between location indicia 80 and 84 in FIG. 3, and subsequent duct 97 and spacer 100 occur between indicia 100 and 104 in that figure.

Once items 21 have been cooled below the drying temperature in the cooling and purging zone ending at the 116-inch point designated in FIG. 3, further cooling of items 21 to temperatures at which they can be conveniently handled can be done with jets formed of ordinary air. Thus, two further plenums, 101 and 102, are shown provided in FIG. 2 after the right-hand exhaust 16 along the path followed by the circuit boards in items 21 in being moved past these last plenums on chains 22 over rails 24 in conveyor 20, but prior to output port 18. Plenum 101 has an air intake, 103, suited for attachment to a source of pressurized air. Similarly, plenum 102 has an air intake, 104, also suited for connection to a source of pressurized air. This source must be capable of supplying 250 ft³/hr of air through each of air intakes 103 and 104.

Once such cooling is completed to reach the desired handling temperatures, items 21 are presented at output port 18 of oven 10 as items having completed the soldering process. There they may be removed from chains 22 of conveyor 20 and readied for further manufacturing steps.

Although the present invention has been described with reference to preferred embodiments, workers skilled in the art will recognize that changes may be made in form and detail without departing from the spirit and scope of the invention.

What is claimed is:

1. A pass-through convection oven having provided therein at least a portion of a conveying means for conveying therethrough selected items positioned on a conveying surface moving at a selected rate, said oven comprising:

an initial gas jet distribution means, having a gas intake suited to receive a flow of a gas, and being capable of providing from a plurality of output orifices therein an initial plurality of gas jets positioned about and directed toward a selected initial portion of that path followed by said conveying surface in moving at said selected rate, said gas jets being in such numbers, and of such output orifice temperatures and gas flow rates, as to establish said selected items at temperatures substantially in a first range of temperatures as they move adjacent to said initial path portion at said selected rate;

a subsequent gas jet distribution means, having a gas intake suited for connection to a supply of gas, and being capable of providing-from a plurality of output orifices therein a subsequent plurality of gas jets positioned about and directed toward a selected subsequent portion of that path followed by said conveying surface in moving at said selected rate after passing said initial portion thereof, said gas jets being in such numbers, and of such output orifice temperatures and gas flow rates, as to establish said selected items in a second range of temperatures as they move adjacent to said subsequent path portion at said selected rate, said second range of temperatures substantially exceeding said first range of temperatures; and an exhaust means, having an outlet suited to provide a flow of a gas, and having a gas gathering means, said gas gathering means being capable of gathering gases located in a vicinity of said subsequent path portion so as to provide a flow thereof through said exhaust means outlet, said exhaust means outlet being connected to said initial gas jet distribution means gas intake.

2. The apparatus of claim 1 wherein said conveying means is an edge conveying means having a spaced apart pair of conveying surfaces on each of which said selected items are supported, and wherein said selected initial portion includes part of those paths followed by each of said conveying surfaces and at least a part of that space occurring therebetween, and wherein said selected subsequent path portion includes part of those paths followed by each of said conveying surfaces and at least a part of that space occurring therebetween.

3. The apparatus of claim 2 wherein each of said conveying surfaces is a portion of a structure supported on and moving over a corresponding rail maintained under a tensile force.

4. The apparatus of claim 3 wherein heaters are provided over said rails.

5. The apparatus of claim 1 wherein said subsequent plurality of gas jets are positioned about said selected subsequent path portion so as to provide a greater average number thereof per unit length over said selected subsequent path portion than do said initial plurality of gas jets in being positioned about said selected initial path portion.

6. The apparatus of claim 3 wherein said orifice temperatures of said subsequent plurality of gas jets exceeds said orifice temperatures of said initial plurality of gas jets.

7. The apparatus of claim 1 wherein said output orifice temperatures of said subsequent plurality of gas jets exceeds said output orifice temperatures of said initial plurality of gas jets.

8. The apparatus of claim 1 further comprising an intermediate gas jet distribution means, having a gas intake suited to receive a flow of a gas, and being capable of providing from output orifices therein an intermediate plurality of gas jets positioned about and directed toward a selected intermediate portion of that path followed by said conveying surface in moving at said selected rate located between said initial path and said subsequent path portions thereof, said gas jets being in such numbers, and of such output orifice temperatures and gas flow rates, as to establish said selected items at temperatures substantially in a third range of temperatures as they move adjacent to said initial path portion at said selected rate, said second range of temperatures substantially exceeding said third range of temperatures.

9. The apparatus of claim 8 wherein said exhaust means gas gathering means has an inlet into which gases are gathered that is located between said subsequent gas jet distribution means and said intermediate gas jet distribution means.

10. The apparatus of claim 8 wherein said gas intake is suited for connection to a supply of gas.

11. The apparatus of claim 8 wherein said subsequent plurality of gas jets, positioned about said selected subsequent path portion, are provided in sufficient number to result in an average number thereof per unit length over said selected subsequent path portion that is greater than that average number per unit length of said intermediate plurality of gas jets over said selected intermediate path portion about which they are positioned.

12. The apparatus of claim 5 further comprising a cooling gas jet distribution means, having a gas intake suited for receiving a flow of gas, and being capable of providing from output orifices therein a cooling plurality of gas jets positioned about and directed toward a selected output portion of that path followed by said conveying surface in moving at said selected rate located after said subsequent path portion thereof, said gas jets in said cooling gas jet distribution means being in such numbers, and of such output orifice temperatures and gas flow rates, as to reduce said temperatures of said selected items to being below said second range of temperatures as they move adjacent to said output path portion at said selected rate.

13. The apparatus of claim 12 wherein said exhaust means gas gathering means has a first inlet into which gases are gathered that is located between said subsequent gas jet distribution means and said intermediate gas jet distribution means, and further has a second inlet into which gases are gathered that is located between said subsequent gas jet distribution means and said cooling gas jet distribution means.

14. The apparatus of claim 5 further comprising an entrance gas jet distribution means, having a gas intake suited for receiving a flow of gas, and being capable of providing from output orifices therein an entrance plurality of gas jets positioned about and directed toward a selected entrance portion of that path followed by said conveying surface in moving at said selected rate located ahead of said initial path portion thereof, said gas jets in said entrance gas jet distribution means being in such numbers, and of such output orifice temperatures and gas flow rates, as to reduce said temperatures of said selected items to being below said second range of temperatures as they move adjacent to said output path portion at said selected rate.

15. The apparatus of claim 1 wherein said supply of gas is nitrogen.

16. The apparatus of claim 1 wherein said initial gas jet distribution means comprises:

an output plenum means with a gas reception opening to an interior volume in a jet distribution shell means having said plurality of output orifices distributed over a surface thereof so as to permit a gas to flow from said output plenum means interior volume through said output plenum means plurality of output orifices toward and about said initial path portion, said output plenum means plurality of output orifices having a cumulative output plenum orifice area;

an input plenum means having said gas intake leading to an interior volume in a gas transport distribution shell means connected to said output plenum means across said gas reception opening, said gas transport distribution shell means having a plurality of gas transport passageways therethrough to permit a gas to flow from said input plenum means interior volume through said input plenum means plurality of gas transport passageways to said output plenum means interior volume, said input plenum means plurality of gas transport passageways having a cumulative input plenum passageway area that is less than said output plenum orifice area; and a heating means capable of transferring heat to a gas in said output plenum means interior space.

17. The apparatus of claim 7 wherein said output plenum means interior volume exceeds said input plenum means interior volume.

18. The apparatus of claim 1 wherein said output orifice temperatures of said subsequent plurality of gas jets exceeds said output orifice temperatures of said intermediate plurality of gas jets.

19. A pass-through convection oven having provided therein at least a portion of a conveying means for conveying therethrough selected items positioned on a conveying surface moving at a selected rate, said oven comprising:

a first gas jet distribution means having a gas intake suited to receive a flow of a gas, said first gas jet distribution means comprising:

an output plenum means with a gas reception opening to an interior volume in a jet distribution shell means having a plurality of output orifices distributed over a surface thereof across from a selected first portion of that path followed by said conveying surface in moving at said selected rate so as to permit a gas to flow from said output plenum means interior volume through said output plenum means plurality of output orifices toward and about said first path portion, said output plenum means plurality of output orifices having a cumulative output plenum orifice area;

an input plenum means having said gas intake leading to an interior volume in a gas transport distribution shell means connected to said output plenum means across said gas reception opening, said gas transport distribution shell means having a plurality of gas transport passageways therethrough to permit a gas to flow from said input plenum means interior volume through said input plenum means plurality of gas transport passageways to said output plenum means interior volume, said input plenum means plurality of gas transport passageways having a cumulative input plenum passageway area that is less than said output plenum orifice area; and a heating means capable of transferring heat to a gas in said output plenum means interior space.

20. The apparatus of claim 19 wherein said output plenum means interior volume exceeds said input plenum means interior volume.

* * * * *

UNITED STATES PATENT AND TRADEMARK OFFICE
CERTIFICATE OF CORRECTION

PATENT NO. : 5,440,101
DATED : August 8, 1995
INVENTOR(S) : NORMAN R. COX, JEAN P. MENARD, WAYNE W. BAER, BRADLEY C. ANDERSON It is certified that error appears in the above-indentified patent and that said Letters Patent is hereby corrected as shown below:

Col. 11, line 19, delete "0.44 in.", and insert --0.44 in$^2$.--

Col. 16, line 52, delete "1", and insert --21--

Signed and Sealed this

Twenty-fourth Day of October, 1995

Attest:

BRUCE LEHMAN

Attesting Officer  Commissioner of Patents and Trademarks